United States Patent
Kagoshima et al.

(10) Patent No.: US 6,830,649 B2
(45) Date of Patent: Dec. 14, 2004

(54) APPARATUS AND METHOD FOR PRODUCING SEMICONDUCTORS

(75) Inventors: Akira Kagoshima, Kudamatsu (JP); Hideyuki Yamamoto, Kudamatsu (JP); Yoshimi Torii, Tokyo (JP); Tatehito Usui, Chiyoda (JP)

(73) Assignees: Hitachi, Ltd., Tokyo (JP); Trecenti Technologies, Inc., Ibaraki (JP); Hitachi High-Technologies, Inc., Tokyo (JP)

(*) Notice: Subject to any disclaimer, the term of this patent is extended or adjusted under 35 U.S.C. 154(b) by 0 days.

(21) Appl. No.: 10/080,539

(22) Filed: Feb. 25, 2002

(65) Prior Publication Data

US 2003/0114011 A1 Jun. 19, 2003

(30) Foreign Application Priority Data

Dec. 18, 2001 (JP) ........................ 2001-384872

(51) Int. Cl.$^7$ ................ C23F 14/00; C25C 14/00; H01L 21/306
(52) U.S. Cl. ............... 156/345; 32/156; 32/345.31; 32/345.24; 204/298.32; 204/345.35; 414/939
(58) Field of Search ................ 204/298.32, 298.35; 153/345.31, 345.32

(56) References Cited

U.S. PATENT DOCUMENTS

| | | | | |
|---|---|---|---|---|
| 5,135,608 A | * | 8/1992 | Okutani ................ | 438/584 |
| 5,310,410 A | * | 5/1994 | Begin et al. ........... | 29/25.01 |
| 5,474,641 A | * | 12/1995 | Otsuki et al. .......... | 438/694 |
| 5,695,564 A | * | 12/1997 | Imahashi ............... | 118/719 |
| 5,766,360 A | * | 6/1998 | Sato et al. ............. | 118/666 |
| 5,769,952 A | * | 6/1998 | Komino ................. | 118/733 |
| 5,913,978 A | * | 6/1999 | Kato et al. ............ | 118/719 |
| 5,934,856 A | * | 8/1999 | Asakawa et al. ........ | 414/217 |
| 5,940,175 A | * | 8/1999 | Sun ..................... | 356/237.3 |
| 5,963,329 A | * | 10/1999 | Conrad et al. ......... | 356/613 |
| 6,042,623 A | * | 3/2000 | Edwards ................ | 29/25.01 |
| 6,106,659 A | * | 8/2000 | Spence et al. ......... | 156/345.43 |
| 6,264,748 B1 | * | 7/2001 | Kuriki et al. .......... | 118/719 |
| 2002/0155629 A1 | * | 10/2002 | Fairbairn et al. ....... | 438/14 |
| 2003/0082466 A1 | * | 5/2003 | del Puerto et al. ...... | 430/22 |

FOREIGN PATENT DOCUMENTS

| | | | | |
|---|---|---|---|---|
| JP | 06302557 A | * | 10/1994 | ......... H01L/21/302 |
| JP | 2000173530 A | * | 6/2000 | ......... H01J/37/317 |

OTHER PUBLICATIONS

M.E. Lee et al., Analysis of Reflectometry and Ellipsometry Data from Patterned Structures, Characterization and Metrology for ULSI Technology: 1998 International Conference, The American Institute of Physics 1998.*

* cited by examiner

*Primary Examiner*—Parviz Hassanzadeh
*Assistant Examiner*—Karla Moore
(74) *Attorney, Agent, or Firm*—Antonelli, Terry, Stout & Kraus, LLP

(57) ABSTRACT

A semiconductor manufacturing apparatus comprising an integrated measuring instrument for measuring the form or size of the element to be formed into a wafer, an etching unit for etching the wafer by making use of plasma generated under reduced pressure, an ashing unit for ashing the etched wafer, a wetting unit for wetting the etched wafer, a drying unit for drying the wafer which has gone through the wetting treatment, a transport means whereby the wafers housed in a wafer cassette are transported one by one successively to said metrology and each treating unit, and a transport chamber provided with a wafer cassette inlet for receiving a cassette containing sheets of wafer to be etched, in which said metrology, etching unit, ashing unit, wetting unit, drying unit and transport means are connected by a depressurizable transport passage.

25 Claims, 7 Drawing Sheets

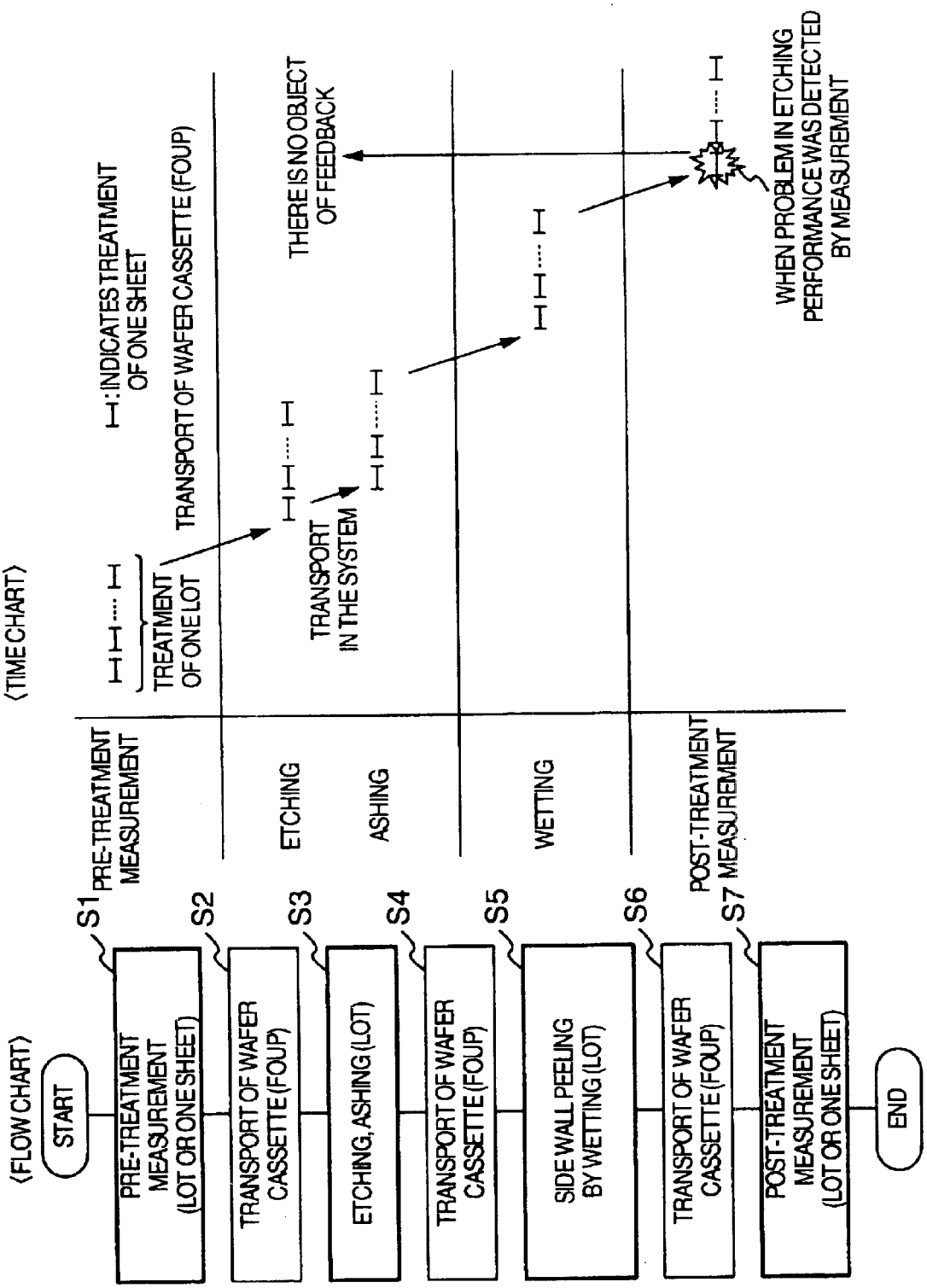

APPARATUS AND METHOD FOR PRODUCING SEMICONDUCTORS

BACKGROUND OF THE INVENTION

1. Field of the Invention

The present invention relates to an apparatus and a method for producing semiconductors, particularly to a semiconductor producing apparatus and method which are suited for conducting desired etching on semiconductor wafers.

2. Description of the Related Art

Referring to the accompanying drawings, FIG. 6 is a schematic illustration of a typical conventional etching system. In the drawing, reference numeral 1 indicates an etching unit which etches the wafer (semiconductor wafer) by making use of plasma generated under reduced pressure. Here, the wafer is worked in conformity to the mask pattern formed on said wafer. Numeral 2 designates an ashing unit which removes the mask remaining on the wafer immediately after etching by ashing process. Numeral 3 is a wafer transport means whereby the wafers contained in a cassette 5 are transported to said units. Numeral 4 refers to a wafer, such as a semiconductor wafer, which is to be etched, and numeral 5 denotes a wafer cassette, which is a jig for transporting the wafers such as semiconductor wafers to be etched. Approximately 25 sheets of wafer are contained in each cassette which is properly set in the etching system 6.

Traffic line C in the drawing indicates the wafer transport route, which shows an example of the order of treatment conducted on each wafer. On completing the etching treatment, the wafer is put back in the cassette 4 and carried to the next step such as wetting. The wafer is then transported to an inspection step such as dimensional inspection. Here, the result of etching work can be known for the first time.

FIG. 7 is a diagram (flow chart and time chart) showing a process of treatments of a wafer (semiconductor wafer) by the said conventional etching system 6.

In step 1, measurements (measurement of size, etc.) of the wafer to be treated are made. Measurements are conducted on the lot base (for the group of wafers contained in each cassette) or on the sheet-by-sheet base. In step 2, the said wafer cassette (including FOUP (front opening unified pod)) is transported to and set in position in the etching system 6. In step 3, etching and ashing are carried out by operating the etching and ashing units 1 and 2. In this operation, the sheet wafers are taken out one by one from the cassette and transported to the etching unit 1 for etching. On completing the etching work by the etching unit 1, the wafer is carried to the ashing unit 2 one by one by the transport means 3 and ashed by said unit 2. The wafer which has finished the ashing treatment is then placed in the cassette 5. In step 4, the wafer-loaded cassette 5 is taken out and transported to a wetting unit not shown. In step 5, the wafer is subjected to a wetting treatment (e.g., for peeling of the side wall) by the wetting unit. In step 6, the wafer-containing cassette is transferred to a measuring device not shown, and in step 7, the post-treatment measurement of size is made.

In the course of etching work, a protective film is formed on the side of the element as shown in FIG. 1, and in some cases, the thickness of this film becomes unnegligibly large vis-à-vis to the controlled value of CD. Therefore, even if an integrated measuring instrument for measurement of CD is incorporated in the etching system, the result of measurement may be affected by the disturbance induced by said protective film, jeopardizing high-precision control of CD. Thus, the results from said integrated measuring instrument may not provide significant data as an index for the control of the above-said and other working steps.

Further, in the conventional system, as shown in FIG. 6, both etching unit 1 and ashing unit 2 are provided in the system 6, and each wafer is transported between them by a transport means.

Also, each working unit is basically designed to perform treatment on the lot base, that is, according to this system, only after the whole number (lot) of the wafers contained in a cassette have been finished with one treatment, they are allowed to proceed to the next treatment step. Thus, the treatment by each working unit is conducted on the lot base as shown by the time chart of FIG. 7. Therefore, according to this system, even if a failure or fault should be detected in step 7 (step for post-treatment measurements) which is the final step, the etching treatment for that lot is already finished, and there is a possibility that many non-conforming wafers exist in the lot.

SUMMARY OF THE INVENTION

The present invention has been made in view of these problems, and it provides a semiconductor producing apparatus and a process therefor according to which the results obtained from the integrated measuring instrument in the etching system can be put to good use as an index for the control of the said and other treating steps, and further, any failure in any working unit such as etching unit is detected in an early stage to reduce the loss of the wafers and the loss of the working time.

In order to solve the above problems, the present invention has incorporated the following means. That is, the semiconductor producing apparatus according to the present invention comprises an integrated measuring instrument for measuring the form or size of the element to be formed into a wafer, an etching unit for etching said wafer by making use of plasma generated under reduced pressure, an ashing unit for ashing said etched wafer, a wetting unit for wetting the etched wafer, a drying unit for drying the wafer which has finished said wetting treatment, a transport means by which said wafers taken into a wafer cassette are transported successively one by one to said integrated measuring instrument and said treating units, and a transport chamber in which said integrated measuring instrument, etching unit; ashing unit, wetting unit, drying unit and transport means are connected to a transport passage designed to be capable of being reduced in pressure, and which is provided with a wafer cassette inlet for receiving the cassette containing a plural number of sheets of wafer to be etched.

Other objects, features and advantages of the invention will become apparent from the following description of the embodiments of the invention taken in conjunction with the accompanying drawings.

BRIEF DESCRIPTION OF THE DRAWINGS

FIG. 7 is a drawing illustrating the treatments for each wafer (semiconductor wafer).

DETAILED DESCRIPTION OF THE INVENTION

The recent years have seen remarkable advancement of miniaturization of element structures aimed at speed-up, reduction of power consumption, etc., of the semiconductor elements. Enhancement of efficiency and precision in the control of element manufacturing process is also advancing acceleratedly for the reduction of manufacturing cost of the elements.

Control of characteristics (operating point) of transistors in the element manufacturing process is usually effected by controlling the gate length (CD value) of transistors. For example, in case the gate length is 150 nm, the scatter of CD value allowed in the gate etching process is approximately 5 nm.

In the ordinary etching process, in order to secure element form (for example, verticality), etching operation is carried out by supplying an additive gas (for example, $O_2$ or CF type gas) to the reactive gas (for example, $Cl_2$ or HBr). The additive gas serves for forming a film (for example, a material containing Si and O or a material containing Si and C) on the side of the element during working to produce an effect as a side wall protective film for preventing further advance of working on the side of the element. However, in case of using certain types of additive gas, the side wall protective film may thicken to about 1 to 5 nm, so that such a film needs to be removed after etching. Also, even if the formed protective film is small in thickness, there is a possibility that the element such as Cl or Br used for etching would remain in the protective film, so that it is necessary to remove the protective film by a cleansing step.

Figure 1:
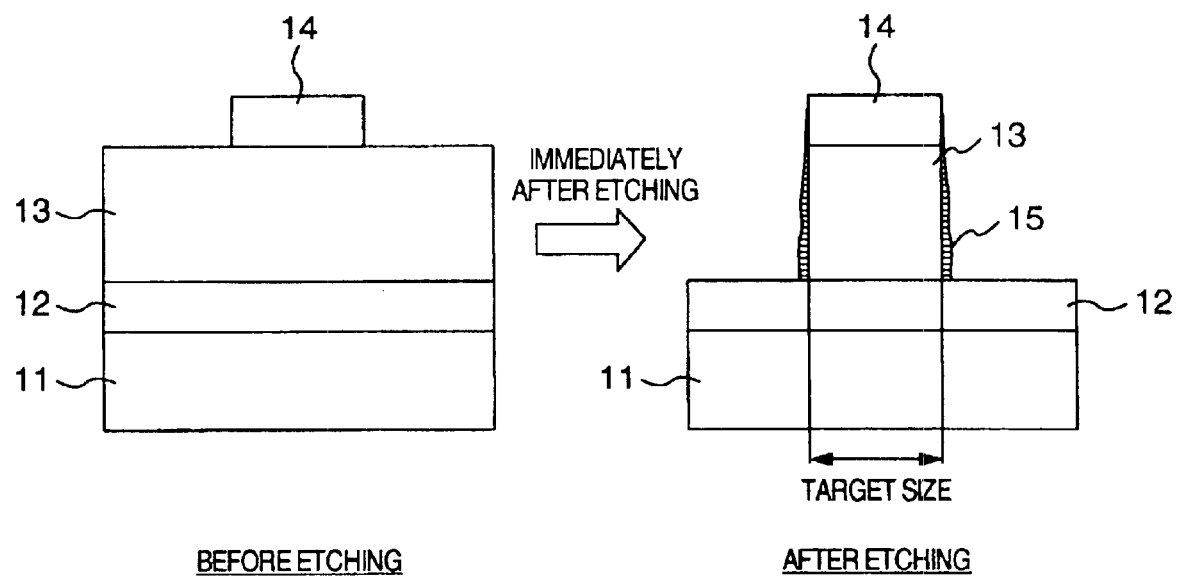
FIG. 1 is a drawing illustrating the side wall protective film formed by etching.

FIG. 1 illustrates the side wall protective film formed by etching, wherein FIG. 1(*a*) shows the condition of the wafer (wafer) before etching and FIG. 1(*b*) shows the condition after etching.

In the drawings, reference numeral 11 indicates a silicon substrate, 12 a ground film, 13 a material to be etched, and 14 a resist pattern.

When anisotropic etching is conducted on the substrate of the condition of FIG. 1(*a*), only the portion of the material to be etched which is not covered with the mask 14 is etched away, as shown in FIG. 1(*b*). Numeral 15 in the drawing refers to the side wall protective film formed on the side of said material by etching.

As viewed above, the thickness (1–5 nm) of the side wall protective film is an amount unnegligible in view of the controlled value of CD. Therefore, in control of the CD value in the semiconductor element manufacturing process, the presence of the protective film can not be ignored.

Figure 2:
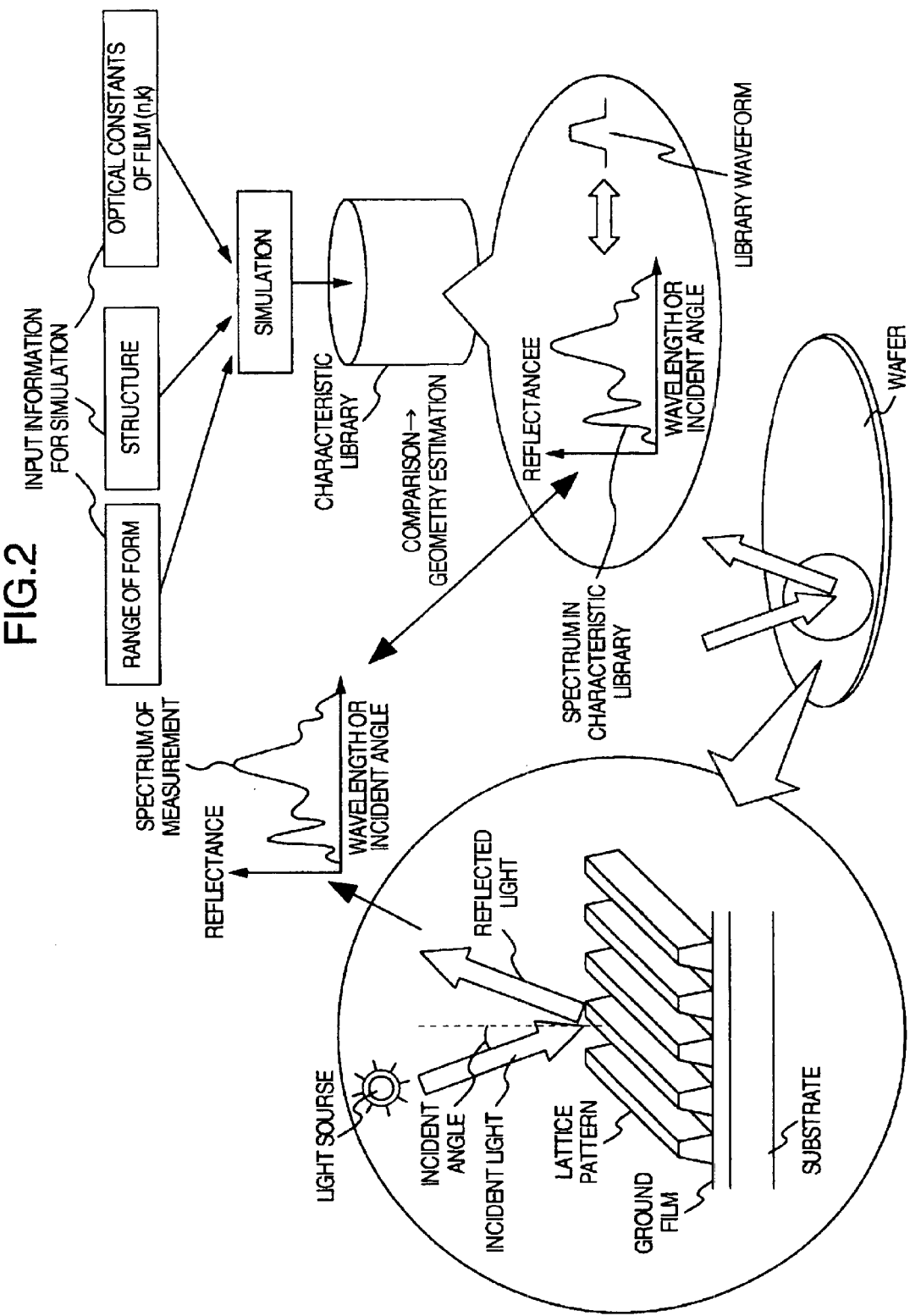
FIG. 2 is a drawing illustrating the process of measurement by the integrated measuring instrument.

FIG. 2 is a diagrammatic chart illustrating the measuring process by an integrated measuring instrument. Here, explanation is made regarding an instance where an optical measuring device called Optical Critical Dimension measuring instrument (which is also called OCD) is used as the integrated measuring instrument.

In this Optical Critical Dimension measuring instrument, light is applied to the lattice mark provided on the wafer, with the wavelength or incident angle being used as parameter, and reflectance (spectral reflectance) is measured. Then the result is compared with the characteristics library previously prepared by theoretical calculations, and the library waveform in good agreement therewith is searched, thereby determining (estimating) the geometry of the lattice mark and the thickness of the ground film.

Generally, said characteristics library is prepared by making use of simulation techniques. As input information for this simulation, the expected form of the subject of measurement, film structure and optical constants (such as refractive index (n) and extinction coefficient (k)) are input. Therefore, in case said input information of the wafer to be measured is unavailable, it is impossible to make measurements of the subject wafer.

Accordingly, measurement is difficult for those films whose form rectified after each treatment is unspecified, such as the said side wall protective film formed after etching, and the films whose composition is unknown. It is therefore necessary to make measurement after removing the unnecessary portions, such as the side wall protective film, by wetting or other suitable treatment.

As another integrated measuring instrument, an atomic force microscope (AFM) which makes use of interatomic force of material can be used. This device, however, requires much time for the measurement, so that it is unpractical as a meter which is expected to make measurement in the course of the treating process as in the present invention.

Figure 3:
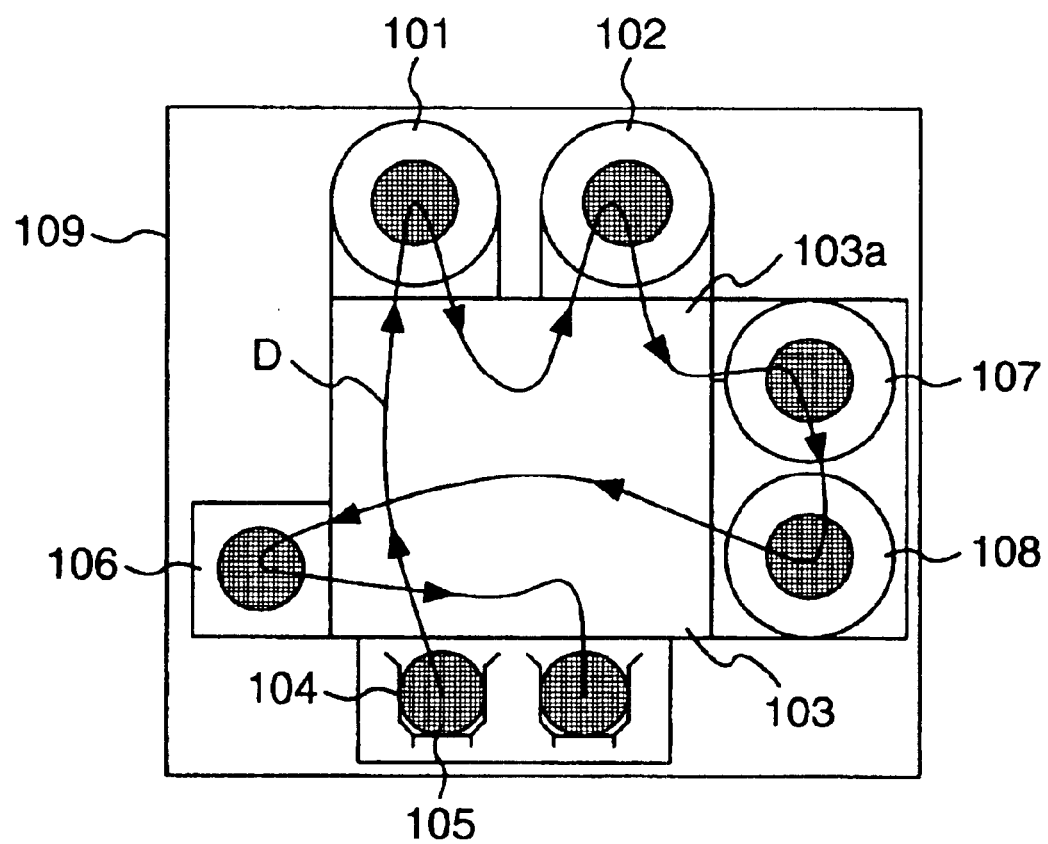
FIG. 3 is a schematic illustration of the semiconductor producing apparatus in an embodiment of the present invention.

FIG. 3 is a schematic illustration of the semiconductor manufacturing system in an embodiment of the present invention. In the illustration, numeral 101 designates an etching unit which etches the wafer (semiconductor wafer) by making use of plasma generated under reduced pressure. Here, the wafer is worked in conformity to the mask pattern formed on said wafer. Numeral 102 refers to an ashing unit which ashes away the mask remaining on the wafer immediately after etching.

103 indicates a wafer transport means comprising a transport passage 103*a* which can be depressurized. This transport means is capable of transporting the wafers contained in a cassette to the integrated measuring instrument and other working units, without being exposed to the air, along said depressurizable transport passage 103*a*.

107 is a wetting unit which functions to remove the corrosive substances produced by the etching work to prevent corrosion of the etched wafer. In the wafer immediately after etching, a side wall protective film may deposit on the wall surface of the etched material as mentioned before. It is a role of said wetting unit to remove this side wall film. 108 is a drying unit which dries the wafer which has gone through the wetting treatment.

106 denotes an integrated measuring instrument which measures the fine worked form of the wafer before and after the treatment done by said etching unit 101. As measurement of the wafer is made after the treatment by said wetting unit 107, it is possible to make correct measurement of form and film thickness, free from the influence of said side wall protective film. This integrated measuring instrument 106 can be operated either under normal pressure or under reduced pressure, so that it may be mounted at a position in the wafer alignment mechanism set under normal pressure or the load lock chamber under reduced pressure, or halfway on the atmospheric air transport passage or wafer transport route, or alongside with any of said working units. As for the way of mounting of this metrology 106, it may be directly installed at any of the above-said positions, or may be fitted in the upper part of a quartz window disposed at any of said positions.

104 represents the wafers such as semiconductor wafers which are to be etched, and 105 designates a fixture which aids transport of the wafer such as semiconductor wafer to be etched. Approximately 25 sheets of wafer are contained in each cassette which is set in position in the etching system 6. A load lock chamber may be provided between said integrated measuring instrument 106, each treating unit and said depressurizable transport passage 103*a*. The transport passage between said wetting unit 107 and drying unit 108 is preferably designed to connect them directly without interposition of said depressurizable transport passage.

Traffic line D in the drawing shows the wafer transport route, representing an example of the process in which the wafer is treated. The wafer which has completed the work by the integral treating system 109 is put back in the cassette 104 and carried to the next step through an inlet port not shown.

Figure 4:
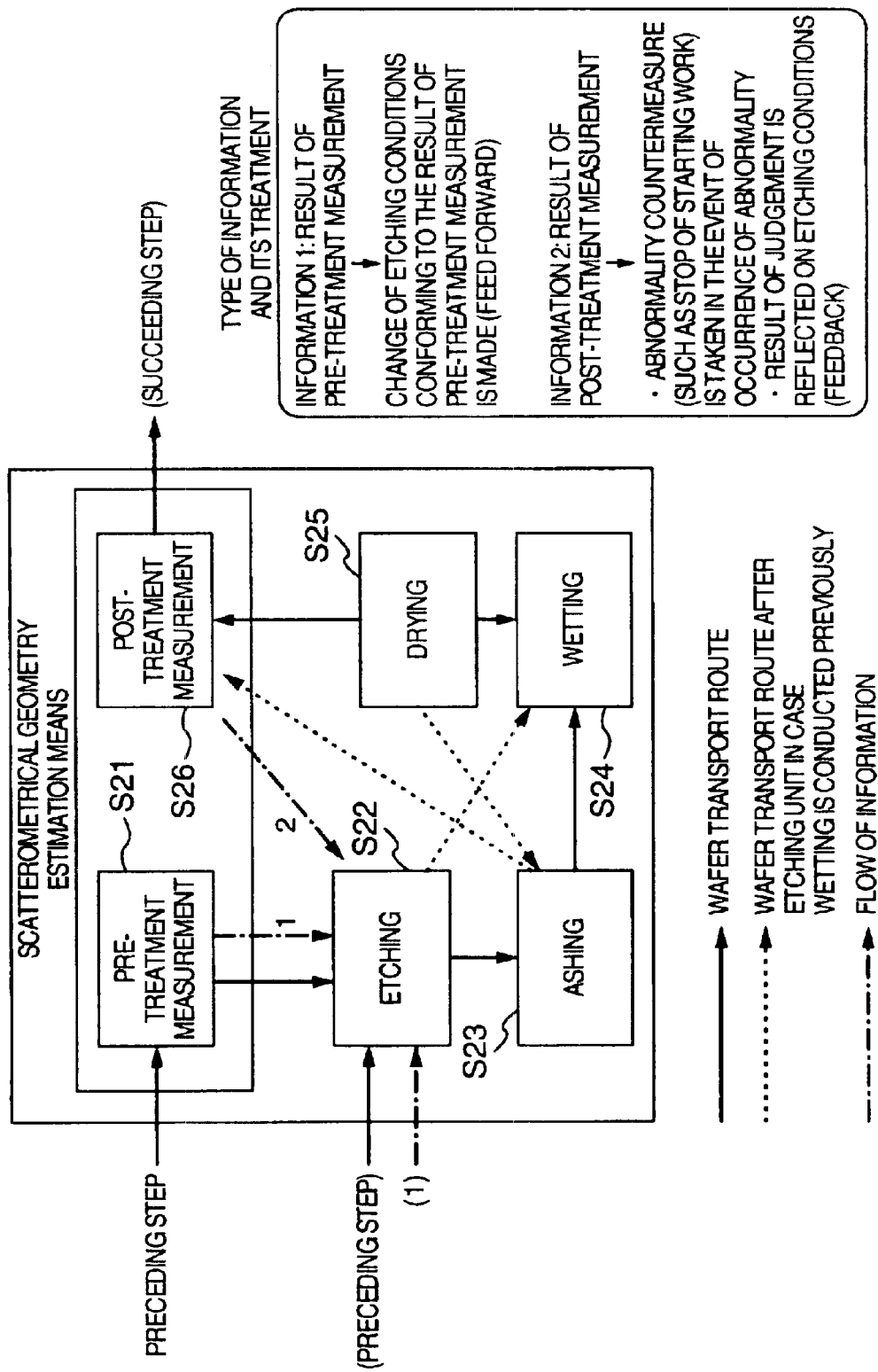
FIG. 4 is a drawing illustrating the integrating process by the semiconductor producing apparatus.

FIG. 4 is a schematic chart illustrating the integral process (through-process) by said semiconductor manufacturing system 109. As mentioned before, this semiconductor manufacturing system comprises an integral metrology, an etching unit, an ashing unit, a wetting unit, a drying unit and a wafer transport means. By the wafer transport means, the wafers (wafers) contained in each wafer cassette are transported one by one successively to the integrated measuring instrument and each working unit.

After the wafer cassette containing the wafers which had got through with the preceding steps has been received, the form or size of each received wafer is measured in step 21. The wafer is etched in step 22. Here, it is possible to rectify the scatter of work in the preceding step by controlling the etching conditions (feed forward controlling) based on the form or the measured values of geometry. Alternatively, after the cassette containing the wafers which had gone through the preceding step has been received, the wafer may be immediately subjected to etching work in step 22 by skipping step 21. Further, the etching conditions may be controlled (feed forward controlling) based on the results of measurements in the inspection step before the said preceding step.

In step 23, ashing is carried out to remove the mask remaining on the wafer immediately after etching. In step 24, the wafer undergoes wetting treatment to get rid of said side wall protective film. In step 25, the wafer is dried. In step 26, the form or size after etching is measured by using said integrated measuring instrument. From the difference between the hereby obtained measured value of form or size after etching and the measured value obtained in step 21, it is possible to detect the amount of etching work done by the semiconductor manufacturing system. Also, the form or the measured value of size after etching or the said difference is fed back to the etching conditions in step 22 to control the said conditions (feed back controlling). Thus, the etching conditions can be optimized by this feed back controlling. The process may be suspended when imperfection of the etching work result is detected.

The above-described process (the process following the order shown by solid lines in the drawing) is carried out in the order of: pre-treatment measurement→etching→ashing→wetting→post-treatment measurement, but it is also possible to carry out the process in the following order (the process following the order shown by broken lines): pre-treatment measurement→etching→wetting→ashing→post-treatment measurement.

It is advised to employ this order in case the side wall protective film can not be removed by the wetting treatment as the protective film is hardened when ashing is conducted before wetting. Here, ashing can be performed after drying which is conducted after wetting.

Figure 5:
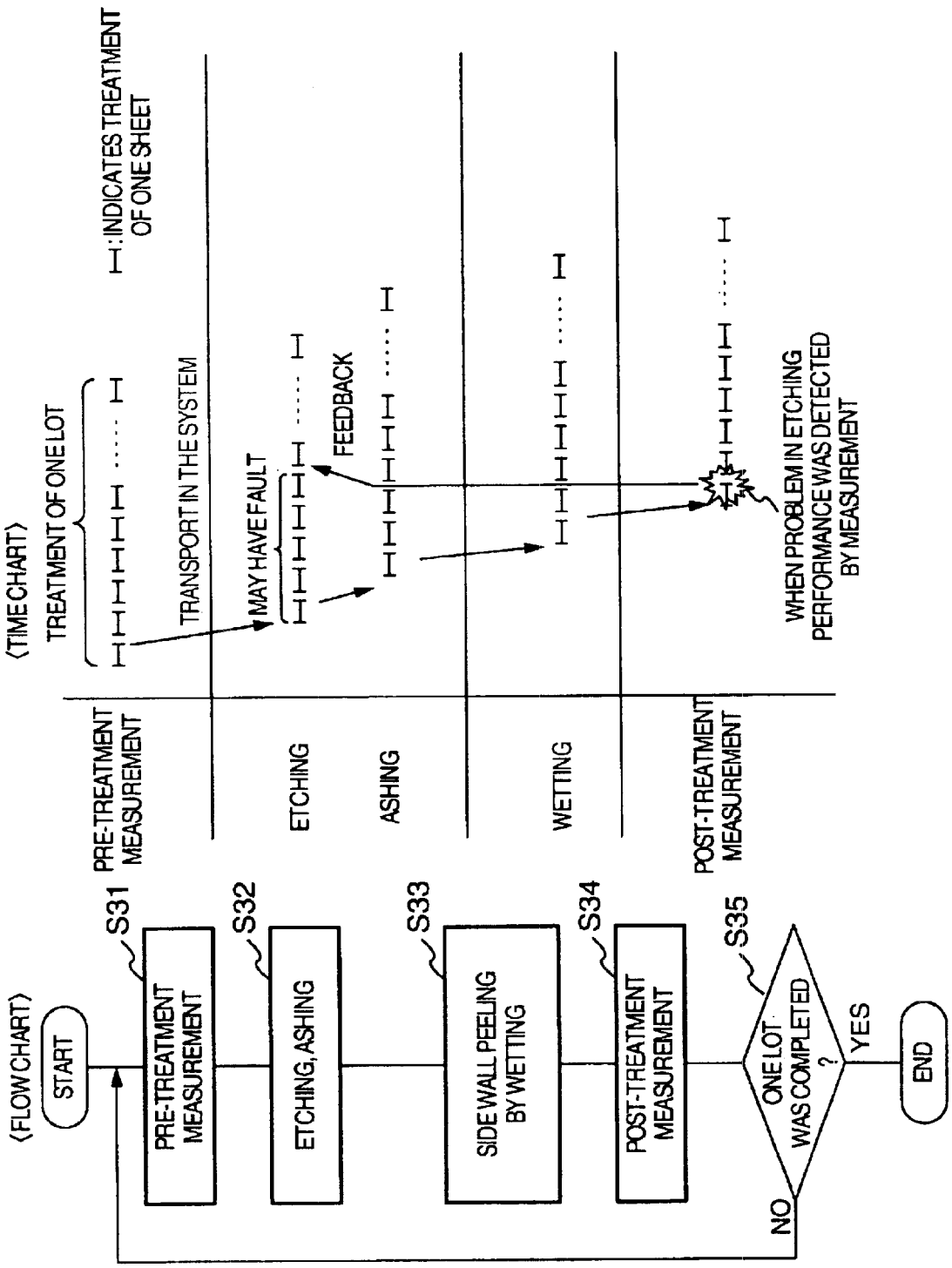
FIG. 5 is a drawing illustrating the treatments for each wafer by the semiconductor producing apparatus.
Figure 6:
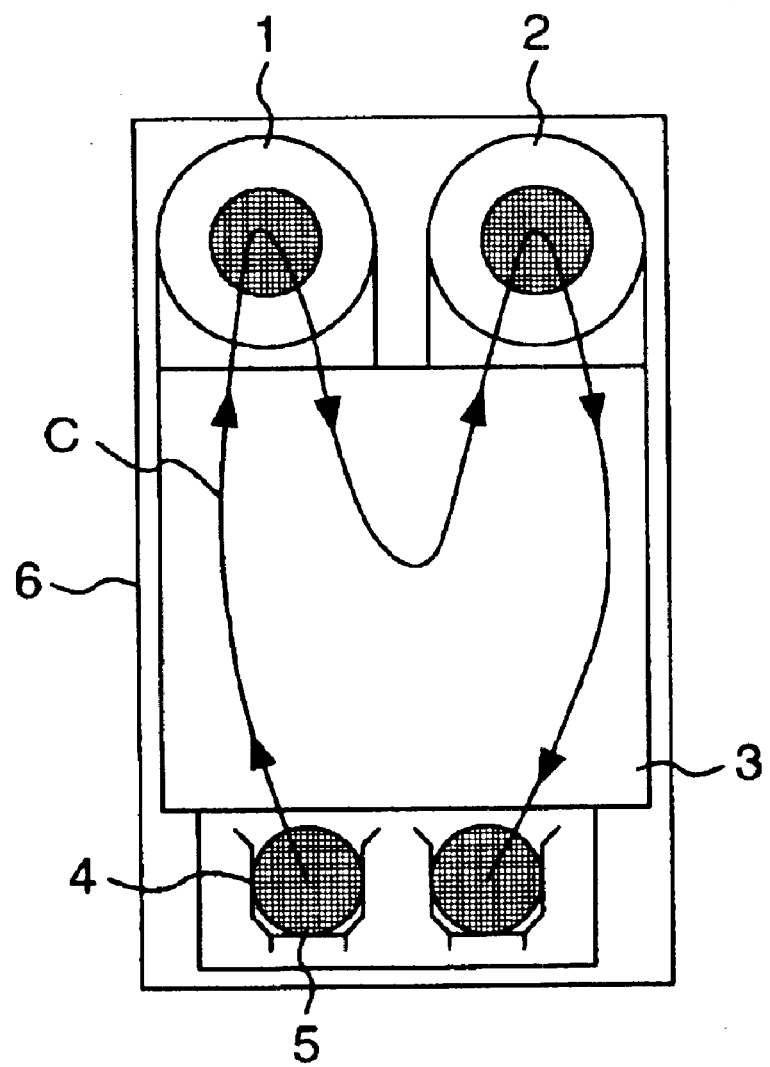
FIG. 6 is a schematic illustration of a typical conventional etching system.

FIG. 5 is the diagrams (flow chart and time chart) illustrating the treating process of each wafer (semiconductor wafer) by the semiconductor manufacturing system. As mentioned before, this semiconductor manufacturing system is provided with a wafer transport means whereby the wafers contained in the cassette 5 are transported one by one to the integrated measuring instrument and each working unit, without being exposed to the outer air, along said depressurizable transport passage 103*a*.

First, the cassette 105 containing the wafers which have got through the preceding steps is set in the semiconductor manufacturing system 109. In step 31, pre-treatment measurements (measurement of size, etc.) of the wafer are made. The wafers contained in the cassette are carried one by one continuously to the integrated measuring instrument 106 and measured successively. In step 32, the wafers which have finished the measurements are conveyed one by one continuously to the etching unit 101 and etched one by one. The etched wafers are then led one by one continuously to the ashing unit 102 and ashed one by one. In step 33, the ashed wafers are transported one by one continuously to the wetting unit 108 to go through the wetting treatment.

In step 34, the wafers which have gone through thewetting treatment are subjected to drying operation and then carried one by one continuously to the integrated measuring instrument 106 whereby the form or size of each wafer is measured. The above process is repeated until one whole lot of the wafers are finished with all said treatments (step 35).

The wafers are worked one by one in each step as shown in the time chart of FIG. 5. Therefore, when a fault is detected in "post-treatment measurement" in the final step 34, this information is immediately fed back to the etching unit to stop its operation or change the etching conditions. It is therefore possible to minimize the number of the wafers which would turn out defective. (In FIG. 5, five sheets of wafer may have fault, but appropriate measure can be taken on the succeeding wafers.)

Further, according to this working system, since the time required for transport between the integrated measuring instrument and each working unit or between the respective working units is short, it is possible to let one sheet of wafer alone go through the whole process (e.g., pre-treatment measurement→etching→ashing→wetting→post-treatment measurement, or pre-treatment measurement→etching→wetting→ashing→post-treatment measurement) in advance of the other wafers as a try-out, and carry out working on the other wafers after confirming the result of the try-out wafer. In this case, it is possible to confine to minimum (only one sheet used for the try-out) the number of the wafers which could become defective.

According to the present invention, as described above, there are provided a semiconductor manufacturing system and a treating process according to which the result of etching work obtained from an integrated measuring instrument can be utilized as an index for the control of the etching and other working steps, and further, it is possible to detect in an early state any working fault of the working units to reduce the loss of the wafers and the working time.

It should be further understood by those skilled in the art that the foregoing description has been made on embodiments of the invention and that various changes and modifications may be made in the invention without departing from the spirit of the invention and the scope of the appended claims.

What is claimed is:

1. A semiconductor manufacturing apparatus comprising:
   an integrated measuring instrument for measuring the form or size of an element to be formed on a wafer;
   an etching unit for etching the wafer by using plasma generated under reduced pressure;
   an ashing unit for ashing the etched wafer;
   a wetting unit for wetting the etched wafer;
   a drying unit for drying the wafer which has gone through a wetting treatment;
   transport means for transporting the wafer to the integrated measuring instrument and each working unit, including the etching unit, the ashing unit, the wetting unit and the drying unit along a depressurizable transport passage; and
   control means for controlling an order of treatment of each working unit, including the etching unit, the ashing unit, the wetting unit and the drying unit for transporting, using said transport means, along the depressurizable transport passage;
   wherein, depending upon an order of treatment designated by said control means, the etched wafer is ashed and then subjected to the wetting treatment, or the etched wafer is wetted and then subjected to an ashing treatment, and afterwards, the etched wafer is measured by the integrated measuring instrument.

2. The semiconductor manufacturing apparatus according to claim 1, wherein the integrated measuring instrument measures is mounted at a position in a wafer alignment mechanism set under normal pressure to measure the form or size of an element to be formed on the wafer.

3. The semiconductor manufacturing apparatus according to claim 1, wherein the integrated measuring instrument is connected to the etching unit, via the depressurizable transport passage, and the wafer is measured under reduced pressure.

4. The semiconductor manufacturing apparatus according to claim 1, wherein the integrated measuring instrument is mounted at a position in a load lock chamber under reduced pressure to measure the form or size of an element to be formed on the wafer.

5. The semiconductor manufacturing apparatus according to claim 1, wherein the integrated measuring instrument measures the form or size of an element to be formed on the wafer based on a spectrum of a reflected version of light applied to the wafer.

6. A semiconductor manufacturing apparatus comprising:
   an integrated measuring instrument for measuring the form or size of the element to be formed on a wafer;
   etching means for etching the wafer by using plasma generated under reduced pressure;
   ashing means for ashing the etched wafer;
   wetting means for wetting the etched wafer;
   drying means for drying the wafer which has gone through a wetting treatment;
   transport means for transporting wafers contained in a wafer cassette one by one successively along a depressurizable transport passage to the integrated measuring instrument for measurement and each working unit, including the etching means, the ashing means, the wetting means and the drying means, for treatment; and
   control means for controlling an order of treatment of each working unit, including the etching means, the ashing means, the wetting means and the drying means for transportation, using said transport means, along the depressurizable transport passage;
   wherein, depending upon an order of treatment designated by said control means, the etched wafer is ashed and then subjected to the wetting treatment, or the etched wafer is wetted and then subjected to an ashing treatment, and afterwards, the etched wafer is again measured by the integrated measuring instrument.

7. The semiconductor manufacturing apparatus according to claim 6, wherein, after a working process of at least one of the wafers contained in the wafer cassette has been completed, the processed wafer is measured by the integrated measuring instrument, the etching means is controlled based on a measured value, and the remaining wafers are processed one by one successively.

8. The semiconductor manufacturing apparatus according to claim 6 or 7, wherein the form or size of the element on the pre-etched wafer transported into the integrated measuring instrument is measured, and the etching means is controlled based on such measurements.

9. The semiconductor manufacturing apparatus according to claim 6 or 7, wherein the form or size of the element on the post-treatment wafer transported into the integrated measuring instrument is measured, and the etching means is controlled based on such measurements.

10. The semiconductor manufacturing apparatus according to claim 6 or 7, wherein the form or size of the element on the pre-etched and post-etched wafer transported into the integrated measuring instrument is measured, and the etching means is controlled based on the difference of such measurements.

11. The semiconductor manufacturing apparatus according to claim 6 or 7, wherein the integrated measuring instrument determines whether to continue or stop the etching based on measurements of the form or size of the element on the wafer.

12. The semiconductor manufacturing apparatus according to claim 1, wherein the integrated measuring instrument estimates the form or size of the element to be formed on the wafer from a spectral distribution of a reflected version of light applied to the wafer.

13. The semiconductor manufacturing apparatus according to claim 1, wherein, after a working process of at least one of the wafers has been completed, the processed wafer is measured by the integrated measuring instrument, and the etching unit is controlled based on measured values, and the remaining wafers are processed one by one successively.

14. The semiconductor manufacturing apparatus according to claim 7, wherein the integrated measuring instrument measures the form or size of an element on the wafer which has completed treatments, and makes optimum control of the etching means based on such measurements.

15. An apparatus for processing a wafer comprising:
   an optical measuring instrument arranged to measure a dimension of a structure to be formed on a wafer;
   an etching unit arranged to etch the wafer, via a mask pattern, to form a structure on the wafer, using plasma generated under reduced pressure, based on an etching condition;
   an ashing unit arranged to remove the mask pattern from the wafer after etching;
   a wetting unit arranged to wet the wafer so as to remove undesirable corrosive substance produced by etching, including any protective film deposited on a sidewall of the structure on the wafer;
   a drying unit arranged to dry the wafer after wetting;

a transport mechanism for transporting individual wafer from a batch placed in a wafer cassette through the optical measuring instrument, the etching unit, the wetting unit and the drying unit along a depressurizable transport passage; and control means for controlling an order of treatment of each working unit, including the etching unit, the ashing unit, the wetting unit and the drying unit for transportation, using said transport mechanism, along the depressurizable transport passage;

wherein, depending upon an order of treatment designated by said control means, the wafer after etching is ashed, via the ashing unit, and then subjected to wetting, via the wetting unit, or, alternatively, the wafer after etching is wetted, via the wetting unit, and then subjected to ashing, via the ashing unit, and afterwards, the structure on the wafer is again measured at the optical measuring instrument for any abnormality such that the etching condition can be optimized for measurement of a next wafer in the batch placed in the wafer cassette.

16. The apparatus according to claim 15, wherein the optical measuring instrument measures is mounted at a position in a wafer alignment mechanism set under normal pressure to measure the form or size of a structure to be formed on the wafer.

17. The apparatus according to claim 15, wherein the optical measuring instrument is connected to the etching unit, via the depressurizable transport passage, and the wafer is measured by the optical measuring instrument under reduced pressure.

18. The apparatus according to claim 15, wherein the optical measuring instrument is mounted at a position in a load lock chamber under reduced pressure to measure the form or size of a structure to be formed on the wafer.

19. The apparatus according to claim 15, wherein the optical measuring instrument measures the form or size of a structure on the wafer based on a spectrum of a reflected version of light applied to the wafer.

20. The apparatus according to claim 15, wherein the optical measuring instrument measures the form or size of a structure on the wafer which has completed treatments, and adjusts the etching condition for the etching unit based on such measurements.

21. An apparatus for processing a wafer comprising:

an optical measuring instrument arranged to conduct a pre-treatment measurement and a post-treatment measurement of each individual wafer in a single batch successively so as to determine a dimension of a structure to be formed on each individual wafer in the single batch;

an etching unit arranged to etch the individual wafer, via a mask pattern, successively to form a structure on the individual wafer in the single batch, using plasma generated under reduced pressure, based on an etching condition;

an ashing unit arranged to remove the mask pattern from the individual wafer after etching successively;

a wetting unit arranged to wet the individual wafer successively so as to remove undesirable corrosive substance produced by etching, including any protective film deposited on a sidewall of the structure on the individual wafer;

a drying unit arranged to dry the individual wafer after wetting successively; and control means for controlling an order of treatment of the etching unit, the ashing unit, the wetting unit and the drying unit, including transporting the individual wafer from the single batch placed in a wafer cassette through the optical measuring instrument, the etching unit, the wetting unit and the drying unit along the depressurizable transport passage;

wherein, depending upon an order of treatment designated by said control means, the wafer after etching is ashed, via the ashing unit, and then subjected to wetting, via the wetting unit, or, alternatively, the wafer after etching is wetted, via the wetting unit, and then subjected to ashing, via the ashing unit, and afterwards, the structure on the wafer is again measured at the optical measuring instrument for any abnormality such that the etching condition can be optimized for measurement of a next wafer in the single batch placed in the wafer cassette.

22. The apparatus according to claim 21, wherein the optical measuring instrument measures is mounted at a position in a wafer alignment mechanism set under normal pressure to measure the form or size of a structure to be formed on the individual wafer.

23. The apparatus according to claim 21, wherein the optical measuring instrument is connected to the etching unit, via the depressurizable transport passage, and the individual wafer is measured by the optical measuring instrument under reduced pressure.

24. The apparatus according to claim 21, wherein the optical measuring instrument is mounted at a position in a load lock chamber under reduced pressure to measure the form or size of a structure to be formed on the individual wafer, and the optical measuring instrument measures the form or size of a structure on the wafer based on a spectrum of a reflected version of light applied to the individual wafer.

25. The apparatus according to claim 21, wherein the optical measuring instrument measures the form or size of a structure on the individual wafer which has completed treatments, and adjusts the etching condition for the etching unit based on such measurements.

* * * * *